(12) United States Patent
Kawamura et al.

(10) Patent No.: US 6,672,210 B2
(45) Date of Patent: Jan. 6, 2004

(54) LITHOGRAPHIC PRINTING PLATE PRECURSOR WITH A GRAFT POLYMERIZED HYDROPHILIC LAYER

(75) Inventors: Koichi Kawamura, Shizuoka (JP); Miki Takahashi, Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 23 days.

(21) Appl. No.: 09/901,117

(22) Filed: Jul. 10, 2001

(65) Prior Publication Data

US 2002/0023565 A1 Feb. 28, 2002

(30) Foreign Application Priority Data

Jul. 13, 2000 (JP) ..................................... P.2000-213142
Jul. 14, 2000 (JP) ..................................... P.2000-214372

(51) Int. Cl.$^7$ ................................................. B41N 1/14
(52) U.S. Cl. ........................ 101/457; 101/456; 101/462
(58) Field of Search ................................. 101/453, 456, 101/457, 460, 462, 463.1, 465, 466, 467; 430/302

(56) References Cited

U.S. PATENT DOCUMENTS 3,907,564 A * 9/1975 Boardman et al. .......... 430/302
3,924,520 A * 12/1975 Boardman et al. .......... 430/302
5,858,606 A * 1/1999 Meisters et al. ............ 430/302
6,093,509 A * 7/2000 Isono et al. ................. 101/457
6,153,352 A * 11/2000 Oohashi et al. ............. 430/302

FOREIGN PATENT DOCUMENTS

| EP | 0 755 803 A1 | 1/1997 |
| EP | 0 922 570 A2 | 6/1999 |
| EP | 1 046 496 A1 | 10/2000 |
| EP | 1 048 457 A2 | 11/2000 |
| EP | 1 052 113 A1 | 11/2000 |
| EP | 1 075 942 A2 | 2/2001 |
| JP | 55-78027 | * 6/1980 |
| JP | 01-238935 | * 9/1989 |
| JP | 11-119413 | * 4/1999 |

* cited by examiner

*Primary Examiner*—Stephen R. Funk
(74) *Attorney, Agent, or Firm*—Burns, Doane, Swecker & Mathis, LLP

(57) ABSTRACT

A novel lithographic printing plate precursor is disclosed, comprising a crosslinked hydrophilic layer having a crosslinked structure and containing a hydrophilic polymer compound having a hydrophilic graft chain, provided on a support.

7 Claims, No Drawings

LITHOGRAPHIC PRINTING PLATE PRECURSOR WITH A GRAFT POLYMERIZED HYDROPHILIC LAYER

FIELD OF THE INVENTION

The present invention relates to a lithographic printing plate precursor having a novel hydrophilic layer. More particularly, the present invention relates to a lithographic printing plate precursor having an excellent sensitivity and stain resistance which can be in either positive-working or negative-working form. Even more particularly, the present invention relates to a lithographic printing plate precursor which can be subjected to imagewise scanning exposure to laser beam according to digital signal so that it requires no development and thus can be directly processed for plate making.

BACKGROUND OF THE INVENTION

Lithography is a printing method using a surface having a lipophilic area which can receive an ink and a hydrophilic or lipophobic area which cannot receive an ink. At present, a photosensitive lithographic printing plate precursor (PS plate) has been widely used as a printing plate material.

As PS plate, a printing plate comprising a photosensitive layer provided on a support such as aluminum plate has been put in practical use and widely used. In operation, such a PS plate is subjected to imagewise exposure and development to remove the photosensitive layer from the non-image area. The hydrophilicity of the surface of the substrate and the lipophilicity of the photosensitive layer on the image area are utilized to effect printing.

However, this PS plate is disadvantageous in that when the hydrophilicity of the surface of the substrate is insufficient, the non-image area is stained.

A so-called direct plate making process involving direct making of offset printing plate from an original without using a plate-making film has begun to be used in the art of ordinary offset printing by making the best of its simplicity requiring no skill, reduced labor and quick operation enabling the formation of printing plate in a short period of time. In particular, with the recent rapid progress of output systems such as pre-press system, image setter and laser printer, a new type of various lithographic printing materials have been developed.

These techniques may be applied to a so-called on-press platemaking, i.e., platemaking process which comprises mounting the printing plate material on the plate cylinder of the printing machine where it is imagewise irradiated with laser beam to make a printing plate. However, these techniques are not suitable for direct printing plate requiring development with an alkaline developer.

As a printing plate requiring no development there has been well-known an unprocessed printing plate comprising a crosslinked hydrophilic layer provided on a substrate and a microcapsulated heat-fusible material contained in the hydrophilic layer as disclosed in WO94/23954. In this printing plate, heat generated by irradiation with laser beam causes the microcapsules to be destroyed, causing the lipophilic material to be eluted and hence hydrophobicizing the surface of the hydrophilic layer. The use of this printing plate precursor makes it possible to obtain the desired printing plate requiring no development. However, this printing plate precursor is disadvantageous in that as printing proceeds, the occurrence of stain gradually increases.

As the hydrophilic substrate or hydrophilic layer to be incorporated in lithographic printing plates there has heretofore been used an anodized aluminum substrate or a substrate or hydrophilic layer obtained by treating the anodized aluminum substrate with an undercoating agent such as silicate, polyvinylphosphonic acid (JP-A-7-1853 (The term "JP-A" as used herein means an "unexamined published Japanese patent application")) and polyvinylbenzoic acid to enhance the hydrophilicity thereof. Extensive studies of hydrophilic substrate or hydrophilic layer comprising such an aluminum support have been made. JP-A-59-101651 discloses a technique involving the use of a polymer having a sulfonic acid group as a subbing layer for photosensitive layer.

On the other hand, referring to hydrophilic layer comprising a flexible support such as PET (polyethylene terephthalate) and cellulose acetate instead of metal support such as aluminum substrate, there are well-known techniques such as swelling hydrophilic layer comprising a hydrophilic polymer and a hydrophobic polymer disclosed in JP-A-8-292558, PET support having a microporous hydrophilic crosslinked silicate surface disclosed in EP0709228 and hydrophilic layer comprising a hydrophilic polymer which is hardened by a hydrolyzed tetraalkylorthosilicate disclosed in JP-A-8-272087 and JP-A-8-507727.

These hydrophilic layers can give a lithographic printing plate which provides printed matters free of stain at the beginning of printing. From the practical standpoint of view, however, a lithographic printing plate precursor has been desired which exhibits a higher hydrophilicity on the hydrophilic layer and thus can prevent the hydrophilic layer from being peeled off the support to provide printed matters of stain even under severe printing conditions.

SUMMARY OF THE INVENTION

It is therefore an object of the present invention to provide a lithographic printing plate precursor which can provide printed matters free of stain.

It is another object of the present invention to provide a lithographic printing plate precursor which can be subjected to scanning exposure to laser beam for image formation in a short period of time so that the plate making can be achieved by a simple water development process or the plate making can be achieved by directly mounting the printing plate on the printing machine without development processing, whereby a good press life (i.e., a good printing durability) can be given and printed matters free of stain can thus be obtained even under severe printing conditions.

It is a further object of the present invention to provide a positive-working or negative-working lithographic printing plate precursor which exhibits a high hydrophilicity on the hydrophilic layer and hence an improved printing stain resistance and thus can give printed matters free of stain under severe printing conditions.

These and other objects of the present invention will become apparent from the following detailed description and examples.

The present inventors made extensive studies of accomplishment of the foregoing objects. As a result, it was found that the foregoing problems can be further solved by incorporating a hydrophilic graft chain in the crosslinked hydrophilic layer and forming an image-forming layer on the crosslinked hydrophilic layer. The present invention has thus been achieved.

The present invention lies in the following aspects:

(1) A lithographic printing plate precursor comprising a crosslinked hydrophilic layer having a crosslinked structure and containing a hydrophilic polymer compound having a hydrophilic graft chain, provided on a support.

(2) The lithographic printing plate precursor according to the above item (1), wherein the crosslinked hydrophilic layer contains a compound which renders the surface of the crosslinked hydrophilic layer hydrophobic when acted upon by heat or when irradiated.

(3) A lithographic printing plate precursor comprising a crosslinked hydrophilic layer having a crosslinked structure and containing a hydrophilic polymer compound having a hydrophilic graft chain and an image-forming layer, provided on a support in this order.

(4) The lithographic printing plate precursor according to the above item (3), wherein the image-forming layer contains a polymer compound having a functional group which changes in its hydrophilicity or hydrophobicity when acted upon by heat or acid, or when irradiated.

(5) The lithographic printing plate precursor according to the above item (1), wherein said crosslinked hydrophilic layer is formed by crosslinking a graft copolymerization polymer using a hydrophilic macromonomer.

The present invention is characterized by an arrangement that the polymer chain in the crosslinked structure in the crosslinked hydrophilic layer has a hydrophilic group incorporated therein as a graft chain. Accordingly, a lithographic printing plate precursor having a high press life which exhibits a high hydrophilicity and thus can be hardly stained on the non-image area thereof, can be obtained. The reason why this effect can be exerted is not clear. However, it is thought that the incorporation of a hydrophilic graft chain having a high mobility in the crosslinked hydrophilic layer allows the fountain solution to be supplied and discharged at a higher rate during printing.

The crosslinked hydrophilic layer may contain a functional group (polarity-converting group) which changes its hydrophilicity or hydrophobicity. The incorporation of a particulate heat-fusible hydrophobic material and a light-to-heat converting material in a matrix made of a hydrophilic polymer compound causes the crosslinked hydrophilic layer to change from hydrophilic to hydrophobic when acted upon by heat or acid, or irradiated with radiations, allowing image formation by scanning exposure to laser beam or the like in a short period of time. In this arrangement, the crosslinked hydrophilic layer acts as an image-forming layer.

Further, an image-forming layer (sensitive layer) containing a polymer compound having a functional group (polarity-converting group) which changes its hydrophilicity or hydrophobicity when acted upon by heat or acid or when irradiated is provided on the crosslinked hydrophilic layer. In this arrangement, image scanning exposure to laser beam or the like in a short period of time can be made, making it possible for the lithographic printing plate precursor to provide a printing plate by a simple water development process or be mounted without development processing on the printing machine for plate making.

As a result, a negative-working lithographic printing plate precursor which exhibits a good press life and thus provides printed matters free of stain even under severe printing conditions can be provided.

Polarity-converting groups can be divided into two groups, i.e., functional group which changes from hydrophobic to hydrophilic and functional group which changes from hydrophilic to hydrophobic. The selection of these polymer compounds having a polarity-converting group makes it possible to provide a positive-working or negative-working lithographic printing plate precursor.

DETAILED DESCRIPTION OF THE INVENTION

The lithographic printing plate precursor according to the present invention will be further described hereinafter.

The lithographic printing plate precursor of the present invention comprises a crosslinked hydrophilic layer having a hydrophilic graft chain incorporated therein provided on a support.

The lithographic printing plate precursor may be either in a one-layer form comprising a crosslinked hydrophilic layer (which also acts as an image-forming layer) containing a compound for rendering the surface thereof hydrophobic or in a two-layer form comprising a photosensitive layer or heat-sensitive layer provided as an image-forming layer on the crosslinked hydrophilic layer of the present invention as described further later. In the case of the two-layer type lithographic printing plate precursor, the photosensitive layer or heat-sensitive layer may be a layer which changes its solubility or hydrophilicity/hydrophobicity or undergoes ablation when irradiated with light or acted upon by heat.

The lithographic printing plate precursor of the present invention will be further described hereinafter.

1. Crosslinked Hydrophilic Layer

The crosslinked hydrophilic layer to be used herein comprises a well-known hydrophilic layer. As well-known hydrophilic layers there are described organic hydrophilic layers having a hydrophilic polymer containing a functional group such as hydroxyl group, amide group, carboxyl group, sulfonic acid group and salt thereof, crosslinked with a crosslinking agent such as polyfunctional isocyanate, polyfunctional epoxy and polyfunctional aldehyde in WO94/23954 and JP-A-9-54429. Further, a hydrophilic layer comprising a hydrophilic polymer having a photo-crosslinkable group incorporated therein is described. The photo-crosslinkable group is optically crosslinked.

Also well-known are a hydrophilic layer comprising a crosslinked polymer containing a metal colloid as described in WO98/40212 and an organic-inorganic hybrid hydrophilic layer comprising a condensate of an organic hydrophilic polymer with a silane coupling agent as described in Japanese Patent No. 2,592,225.

The effect of introducing a graft chain according to the present invention can be exerted in any hydrophilic layer. In particular, the foregoing effect can be fairly exerted in the organic crosslinked hydrophilic layer from the standpoint of producibility.

The organic crosslinked hydrophilic layer has the following structure.

As the hydrophilic binder polymer having a three-dimensionally crosslinked structure of the present invention there may be used a networked polymer formed by carbon—carbon bond containing as side chains one or a plurality of hydrophilic functional groups such as carboxyl group, amino group, phosphoric acid group, sulfonic acid group, salt thereof, hydroxyl group, amide group and polyoxyethylene group; or a networked polymer formed by carbon atoms or carbon—carbon bonds connected by at least one hetero atom such as oxygen, nitrogen, sulfur and phosphorus optionally containing as side chains one or a plurality of hydrophilic functional groups such as carboxyl group, amino group, phosphoric acid group, sulfonic acid group, salt thereof, hydroxyl group, amide group and polyoxyethylene group. Examples of these polymers include poly (meth)acrylate-based polymer, polyoxyalkylene-based polymer, polyurethane-based polymer, epoxy ring-opening addition polymer, poly(meth)acrylic acid-based polymer, poly (meth) acrylamide-based polymer, polyester-based polymer, polyamide-based polymer, polyamine-based polymer, polyvinyl-based polymer, polysaccharide-based polymer, and composite polymer thereof.

In particular, a polymer having any of hydroxyl group, carboxyl group, alkaline metal salt thereof, amino group, halogenated hydrogen salt thereof, sulfonic acid group, amine, alkaline salt and alkaline earth metal salt thereof and amide group or a repetition of these groups in combination in the side chain of segment or a polymer having a polyoxyethylene group imposed on a part of these hydrophilic functional groups and main chain segment has a high hydrophilicity and thus is desirable. In addition to these polymers, a hydrophilic binder polymer having an urethane bond or urea bond in its main chain or side chain improves not only hydrophilicity but also press life (i.e., printing durability) of non-image area and thus is desirable.

The binder polymer of the present invention may contain various other components described later incorporated therein as necessary. Specific examples of the three-dimensionally crosslinked hydrophilic binder polymer of the present invention will be given below. As a hydrophilic binder copolymer, a hydrophilic homopolymer or copolymer is synthesized from at least one of hydrophilic monomers having a hydrophilic group such as hydroxyl group, carboxyl group, salt thereof, sulfonic acid group, salt thereof, phosphoric acid, salt thereof, amide group, amino group and ether group, e.g., (meth)acrylic acid, alkali or amine salt thereof, itaconic acid, alkali or amine salt thereof, 2-hydroxyethyl (meth)acrylate, (meth)acrylamide, N-monomethylol (meth) acrylamide, N-dimethylol (meth) acrylamide, 3-vinyipropionic acid, alkali or amine salt thereof, vinylsulfonic acid, alkali or amine salt thereof, 2-sulfoethyl (meth)acrylate, polyoxyethylene glycol mono (meth)acrylate, 2-acrylamide-2-methylpropanesulfonic acid, acid phosphoxypolyoxyethylene glycol mono(meth)acrylate, allylamine, mineral acid salt thereof.

The hydrophilic binder polymer having a functional group such as hydroxyl group, carboxyl group, amino group, salt thereof and epoxy group in the hydrophilic polymer makes the use of these functional groups to form an unsaturated group-containing polymer having an addition-polymerizable double bond such as vinyl group, allyl group and (meth)acryl group or ring-forming group such as cinnamoyl group, cinnamylidene group, cyanocinnamylidene group and p-phenylene diacrylate group incorporated therein. If necessary, to the unsaturated group-containing polymer are then added monofunctional and polyfunctional monomers copolymerizable with the unsaturated group, and the polymerization initiator and other components described later. The mixture is then dissolved in a proper solvent to prepare a dope. The dope thus prepared is applied to the support described later, and then dried, followed by or accompanied by three dimensional crosslinking.

The hydrophilic binder polymer containing an active hydrogen-containing group such as hydroxyl group, amino group and carboxyl group is added to the foregoing solvent containing no active hydrogen with an isocyanate compound or block polyisocyanate compound and other components described later to prepare a dope which is applied to a support, and then dried, followed by or accompanied by three dimensional crosslinking reaction. As copolymerizable components constituting the hydrophilic binder polymer there may be used glycidyl group such as glycidyl (meth) acrylate and monomer having carboxyl group such as (meth) acrylic acid. The hydrophilic binder polymer having glycidyl group can be subjected to three-dimensional crosslinking using the ring-opening reaction with α,ω-alkane or alkenedicarboxylic acid such as 1,2-ethanedicarboxylic acid and adipic acid, polycarboxylic acid such as 1,2,3-propanetricarboxylic acid and trimellitic acid, polyamine compound such as 1,2-ethanediamine, diethylenediamine, diethylenetriamine and α,ω-bis-(3-aminopropyl)-polyethylene glycol ether, oligoalkylene or polyalkylene glycol such as ethylene glycol, propylene glycol, diethylene glycol and tetraethylene glycol or polyhydroxy compound such as trimethylolpropane, glycerin, pentaerythritol and sorbitol used as a crosslinking agent.

The hydrophilic binder polymer having carboxyl group or amino group can be subjected to three-dimensional crosslinking using the epoxy ring-opening reaction with ethylene or a polyepoxy compound such as propylene glycol diglycidyl ether, polyethylene glycol diglycidyl ether, polypropylene glycol diglycidyl ether, neopentyl glycol glycidyl ether, 1,6-hexanediol diglycidyl ether and trimethylolpropane triglycidyl ether used as a crosslinking agent.

Other examples of the crosslinking agent to be used in three dimensional crosslinking include methylol group as a functional group, alkoxymethyl group obtained by alcohol condensation of methylol group, and amino compound having at least two acetoxymethyl groups. Specific examples of these crosslinking agents include melamine derivatives such as methoxymethylated melamine (e.g., Cymel 300 Series (1), produced by Mitsui Cyanamide Co., Ltd.), benzoquanamine derivatives (e.g., methyl/ethyl mixed alkoxylated benzoguanamine resin, such as Cymel 1100 Series (2), produced by Mitsui Cyanamide Co., Ltd.), glycoluryl derivatives (e.g., tetramethylol glycol uryl resin, such as Cymel 1100 Series (3), produced by Mitsui Cyanamide Co., Ltd.), urea resin derivatives, and resol resin.

A hydrophilic binder polymer comprising a polysaccharide such as cellulose derivative, polyvinyl alcohol, partial saponification product thereof, glycidol homopolymer, glycidol copolymer, singly or in combination, as a base can make the use of the hydroxyl group contained therein to introduce the foregoing crosslinkable functional group thereinto, making it possible to provide a three-dimensionally crosslinked structure according to the foregoing method.

Preferred among the foregoing hydrophilic binder polymers are those obtained by three-dimensionally crosslinking by the foregoing method hydrophilic homopolymer or copolymers synthesized from at least one selected from the group consisting of hydrophilic monomers having a hydrophilic group such as carboxyl group, sulfonic acid group, phosphoric acid, amino group, salt thereof, hydroxyl group, amide group and ether group, such as (meth)acrylic acid, alkaline metal or amine salt thereof, itaconic acid, alkaline metal or amine salt thereof, 2-hydroxyethyl (meth)acrylate, (meth)acrylamide, N-monomethylol (meth)acrylamide, N-dimethylol (meth) acrylamide, allylamine, halogenated hydrogenic acid salt thereof, 3-vinylpropionic acid, alkaline metal or amine salt thereof, vinylsulfonic acid, alkaline metal or amine salt thereof, 2-sulfoethylene (meth) acrylate, polyoxyethylene glycol mono(meth)acrylate, 2-acrylamide-2-methylpropanesulfonic acid, acid phosphoxypolyoxyethylene glycol mono (meth) acrylate, allylamide and halogenated hydrogenic acid salt thereof or hydrophilic binder polymers comprising a polyoxymethylene glycol or polyoxyethylene glycol.

2. Introduction of Graft Chain In Crosslinked Hydrophilic Layer

The crosslinked hydrophilic layer having a hydrophilic graft chain incorporated therein can be normally prepared by a well-known method known as graft polymer synthesis method. For the details of the synthesis of graft polymer, reference can be made to Fumio Ide, "Gurafuto jugo to sono ouyou (Graft polymerization and its application)", Koubunshi Kankokai, 1977, and "Shinkoubunshi jikkengaku 2

(Experiment on polymers: new edition 2): koubunshi no gousei hannou (Synthesis and reaction of polymers)", The Society of Polymer Science, Japan, Kyoritsu Shuppan, 1995.

Methods of synthesis of graft polymer can be essentially divided into three groups, i.e., (1) method involving polymerization branch monomers from trunk polymer, (2) method involving the bonding of branch polymers to trunk polymer, and (3) method involving copolymerization of trunk polymer with branch polymers (macromer process).

Any of these methods can be used to prepare the hydrophilic layer of the present invention. In practice, however, macromer process (method (3)) is particularly excellent from the standpoint of producibility and controllability of layer structure.

For the details of the synthesis of graft polymer using macromer, reference can be made to the above cited "Shinkoubunshi jikkengaku 2 (Experiment on polymers: new edition 2): koubunshi no gousei hannou (Synthesis and reaction of polymers)", The Society of Polymer Science, Japan, Kyoritsu Shuppan, 1995, and Yuya Yamashita, "Makuromonoma no kagaku to kogyo (Chemistry and industry of macromonomer), IPC, 1989. In some detail, hydrophilic monomers described in detail above with reference to the organic crosslinked hydrophilic layer such as acrylic acid, acrylamide, 2-acrylamide-2-methylpropanesulfonic acid and N-vinylacetamide can be processed according to the method described in these references to synthesize hydrophilic macromers.

Particularly useful among the hydrophilic macromers to be used herein are macromers derived from monomers containing carboxyl group such as acrylic acid and methacrylic acid, sulfonic acid-based macromers derived from monomers of 2-acrylamide-2-methylpropanesulfonic acid, vinylstyrene sulfonic acid and salt thereof, amide-based macromers derived from N-vinylcarboxylic acid amide monomer such as N-vinylacetamide and N-vinylformamide, macromers derived from hydroxyl group-containing monomers such as hydroxyethyl methacrylate, hydroxyethyl acrylate and glycerol monomethacrylate, and macromers derived from alkoxy group or ethylene oxide group-containing monomers such as methoxyethyl acrylate, methoxypolyethylene glycol acrylate and polyethylene glycol acrylate. Further, monomers having polyethylene glycol chain or polypropylene glycol chain can be used as macromers of the present invention.

The effective molecular weight of these macromers is from 400 to 100,000, preferably from 1,000 to 50,000, particularly from 1,500 to 20,000. When the molecular weight of the macromers is less than 400, the desired effect cannot be exerted. On the contrary, when the molecular weight of the macromers exceeds 100,000, the macromers can hardly be polymerized with the copolymerization monomer constituting the main chain.

One of the methods for preparing the crosslinked hydrophilic layer having a hydrophilic graft chain incorporated therein after the synthesis of these hydrophilic macromers comprises copolymerizing the foregoing hydrophilic macromer with other monomers having a reactive functional group to synthesize a graft-copolymerized polymer, and then allowing the reactive functional group in the polymer to react with the crosslinking agent contained in the hydrophilic layer for crosslinking or, if the other monomers to be copolymerized with the macromer has a photo-crosslinkable group, allowing the reactive functional group to undergo photo-crosslinking with light.

In order to prepare the foregoing crosslinked hydrophilic layer, the composition to be crosslinked can be applied to the support described later, and then allowed to undergo photopolymerization reaction by total irradiation with ultraviolet rays on the surface of the coat layer or heat polymerization reaction so that it is crosslinked. In the case where the crosslinked hydrophilic layer becomes hydrophobic on the surface thereof to act as an image-forming layer itself when acted upon by heat or the like, the required polymerization energy is such that the image-forming layer doesn't change its hydrophilicity or hydrophobicity. To this end, the foregoing photopolymerization reaction is preferred as compared with heat polymerization reaction.

(Photopolymerization Initiator)

In order to prepare the crosslinked hydrophilic layer of the lithographic printing plate precursor of the present invention by polymerization reaction caused by total exposure to ultraviolet rays, it is preferred that a photopolymerization initiator be incorporated in the components of the crosslinked hydrophilic layer composition. Examples of the photopolymerization initiator to be used herein include those described in U.S. Pat. Nos. 2,760,863 and 3,060,023, and JP-A-62-121448.

The content of the photopolymerization initiator in the crosslinked hydrophilic layer of the present invention is preferably from 0.01 to 20% by weight based on the total solid content of the crosslinked hydrophilic layer.

When the content of the photopolymerization initiator is less than 0.01% by weight, the effect of the initiator cannot be exerted. On the contrary, when the content of the photopolymerization initiator exceeds 20% by weight, the initiator absorbs active rays, making it difficult for active rays to reach the interior of the crosslinked hydrophilic layer and hence making it impossible to accomplish the desired press life.

(Thickness of Crosslinked Hydrophilic Layer)

In the case of single-layer type lithographic printing plate precursor comprising a crosslinked hydrophilic layer which acts also as an image-forming layer, the thickness of the crosslinked hydrophilic layer is from 0.01 g/m$^2$ to 50 g/m$^2$, preferably from 0.1 g/m$^2$ to 20 g/m$^2$.

In the case of two-layer type lithographic printing plate precursor comprising a photosensitive layer or heat-sensitive layer both as a crosslinked hydrophilic layer and an image-forming layer, the thickness of the crosslinked hydrophilic layer is from 0.001 g/m$^2$ to 50 g/m$^2$, preferably from 0.01 g/m$^2$ to 10 g/m$^2$. When the thickness of the crosslinked hydrophilic layer is too small, the effect of hydrophilicity cannot be exerted. On the contrary, when thickness of the crosslinked hydrophilic layer is too great, the crosslinked hydrophilic layer exhibits a deteriorated adhesion to the sensitive layer, deteriorating the press life (i.e., the printing durability) of the lithographic printing plate precursor.

(Thermally Surface-Hydrophobicized Compound)

As the compound which is incorporated in the crosslinked hydrophilic layer to render the surface of the lithographic printing plate precursor hydrophobic during heat printing there may be used a compound which changes from hydrophilic to hydrophobic or a particulate heat-fusible hydrophobic material. Examples of the compound which changes from hydrophilic to hydrophobic include decarboxylated compounds disclosed in EP 0980754. Examples of the particulate heat-fusible hydrophobic material include polystyrene disclosed in EP816070. Further, microcapsulated particulate hydrophobic materials disclosed in WO94/23954 may be used.

In this case, as the particulate heat-fusible hydrophobic material to be incorporated in the crosslinked hydrophilic layer which acts as an image-forming layer there may be used a hydrophobic organic compound having a melting point of from 50° C. to 200° C., preferably not lower than 85° C. Examples of the hydrophobic organic compound employable herein include polystyrene, polyvinyl chloride, methyl polymethacrylate, polyvinylidene chloride, polyacrylonitrile, polyvinyl carbazole, and copolymer or mixture thereof. Other examples of the hydrophobic organic compound include polyolefin waxes such as paraffin wax, microwax, polyethylene wax and polypropylene wax, aliphatic acid-based waxes such as stearamide, linolenamide, laurylamide, myristyrylamide, palmitamide and oleic acid amide, and higher aliphatic acids such as stearic acid, tridecanoic acid and palmitic acid.

When the melting point of the particulate heat-fusible hydrophilic material is not higher than 50° C., the effect of heat generated upon drying of coat layer causes softening and melting of the particles. The upper limit of the melting point of the particulate material is not specifically limited. In practice, however, the upper limit of the melting point of the particulate material is preferably not higher than 200° C. from the standpoint of handleability.

Description of Image-Forming Layer:

As the image-forming layer of the present invention there may be used the conventional PS plate or a positive-working or negative-working photosensitive layer well-known in the conventional photoresist besides the photosensitive or heat-sensitive layer containing a polymer compound having a functional group which changes its hydrophilicity or hydrophobicity.

As the image-forming layer of the lithographic printing plate precursor of the present invention there will be firstly described the image-forming layer containing a polymer compound having a functional group (polarity-converting group) which changes its hydrophilicity or hydrophobicity when acted upon by heat or acid or when irradiated.

Polarity-converting groups can be divided into two groups, i.e., functional group which changes from hydrophobic to hydrophilic and functional group which changes from hydrophilic to hydrophobic.

(Polymer Having in its Side Chain a Functional Group Which Changes from Hydrophobic to Hydrophilic)

Specific examples of the polymer having in its side chain a functional group which changes from hydrophobic to hydrophilic among the polymers having side chains which change its hydrophilicity or hydrophobicity include sulfonic acid ester polymers and sulfonamides disclosed in JP-A-10-282672, and carboxylic acid ester polymers disclosed in EP0652483, JP-A-6-502260, and JP-A-7-186562.

Particularly useful among these polymers having side chains which change from hydrophobic to hydrophilic are secondary sulfonic acid ester polymers, tertiary carboxylic ester polymers, and carboxylic acid alkoxyalkyl ester polymers.

Specific examples of the sulfonic acid ester polymer and carboxylic acid ester polymer employable herein include the following sulfonic acid ester polymers 1p-1 to 1p-8 and carboxylic acid ester polymers a1 to a10, but the present invention should not be construed as being limited thereto.

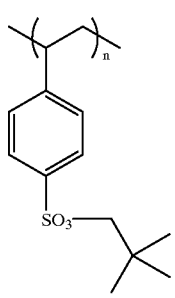

(1p-1)

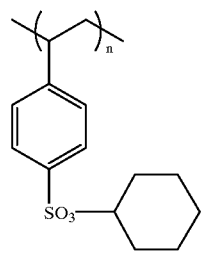

(1p-2)

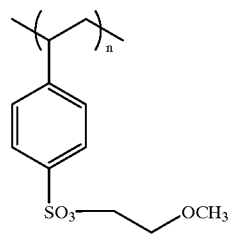

(1p-3)

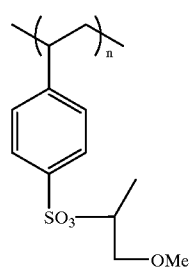

(1p-4)

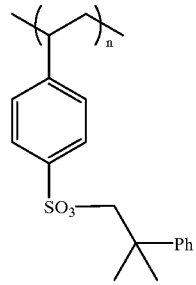

(1p-5)

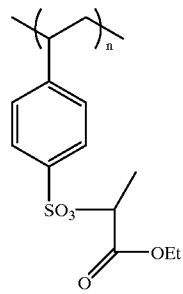

(1p-6)

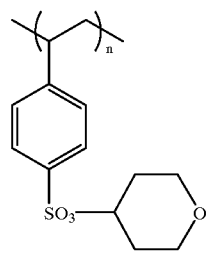

(1p-7)

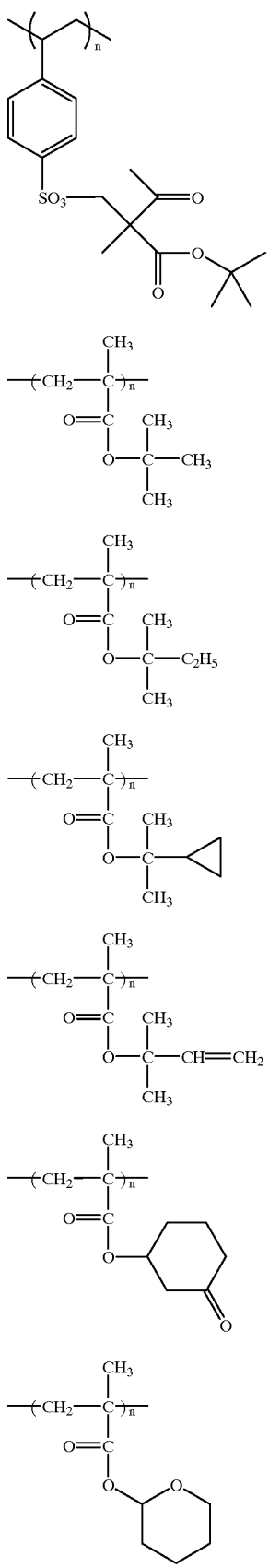

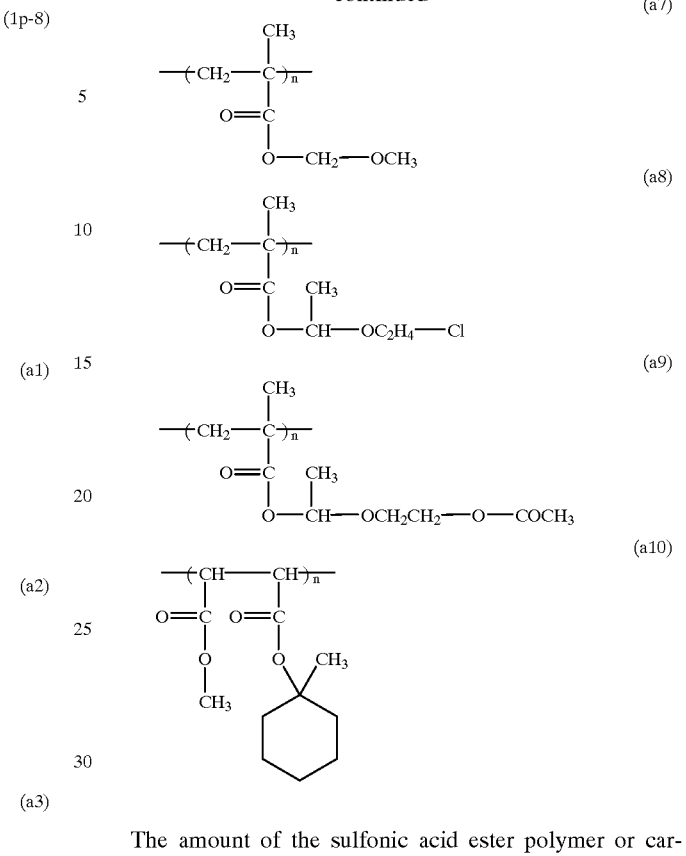

The amount of the sulfonic acid ester polymer or carboxylic acid ester polymer, if any, is from about 5 to 99% by weight, preferably from 10 to 98% by weight, more preferably from about 30 to 90% by weight based on the total solid content of image-forming layer (photosensitive layer or heat-sensitive layer).

Specific examples of the polymer having in its side chain a functional group which changes from hydrophilic to hydrophobic include polymer having ammonium salt group disclosed in JP-A-6-317899, and polymer having decarboxylation type polarity-converting group represented by the following general formula (1) such as sulfonylacetic acid as disclosed in JP-A-2000-309174.

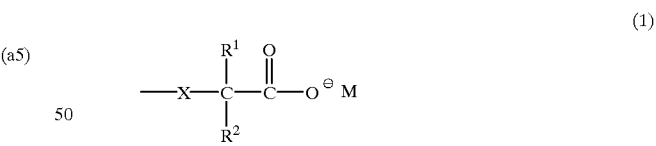

wherein X represents —O—, —S—, —Se—, —NR$^3$-, —CO—, —SO—, —SO$_2$—, —PO—, —SiR$^3$R$^4$- or —CS—; R$^1$, R$^2$, R$^3$ and R$^4$ each independently represent a monovalent group; and M represents an ion having a positive charge.

Specific examples of R$^1$, R$^2$, R$^3$ and R$^4$ include —F, —Cl, —Br, —I, —CN, —R$^5$, —OR$^5$, —OCOR$^5$, —OCOOR$^5$, —OCONR$^5$R$^6$, —OSO$_2$R$^5$, —COR$^5$, —COOR$^5$, —CONR$^5$R$^6$, —NR$^5$R$^6$, —NR$^5$—COR$^6$, NR$^5$—COOR$^6$, —NR$^5$—CONR$^6$R$^7$, —SR$^5$, —SOR$^5$, —SO$_2$R$^5$, and —SO$_3$R$^5$.

Specific examples of R$^5$, R$^6$ and R$^7$ include hydrogen, alkyl group, aryl group, alkenyl group, and alkinyl group. Specific examples of these functional groups include those listed previously.

Preferred among the groups represented by $R^1$, $R^2$, $R^3$ and $R^4$ are hydrogen, alkyl group, aryl group, alkinyl group, and alkenyl group.

The polarity-converting polymer compound of the present invention may be either a homopolymer of one of the foregoing monomers having a hydrophilic functional group or a copolymer of two or more of these monomers. The polarity-converting polymer compound of the present invention may be a copolymer of these monomers with other monomers so far as the effect of the present invention is not impaired.

Specific examples of the other monomers to be used in the synthesis of the polarity-converting polymer compound include compounds having ethylenically unsaturated double bond described previously.

The proportion of the other monomers to be used in the synthesis of the copolymer may be arbitrary so far as the resulting polymer compound can change from hydrophilic to hydrophobic when acted upon by heat but is preferably not greater than 80% by weight, more preferably not greater than 50% by weight.

The polarity-converting polymer compound to be used herein can be prepared by any well-known method as described in "Koubunshi Kagaku (Polymer chemistry)", vol. 7, page 142 (1950). In other words, the polarity-converting polymer compound may be any of random polymer, block polymer and graft polymer, preferably random polymer. This may be properly predetermined depending on the polymerization method. For example, radical polymerization in the presence of a polymerization initiator such as peroxide (e.g., di-t-butyl peroxide, benzoyl peroxide), persulfate (e.g., ammonium persulfate) and azo compound (e.g., azobisisobutyronitrile) may be employed. The polymerization can be accomplished by solution polymerization, emulsion polymerization, suspension polymerization or the like. The polymerization degree of the polarity-converting polymer compound is not specifically limited.

Examples of the solvent to be used in the synthesis of the polarity-converting polymer compound of the present invention include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide, and water. These solvents may be used singly or in combination of two or more thereof.

Specific examples of the polarity-converting polymer compound of the present invention will be given below, but the present invention should not be construed as being limited thereto.

P-1

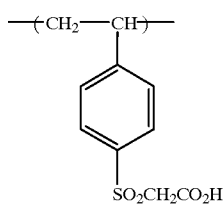

P-2

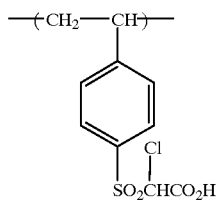

P-3

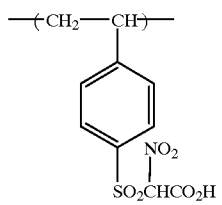

P-4

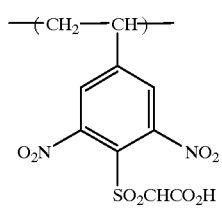

P-5

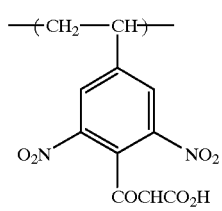

P-6

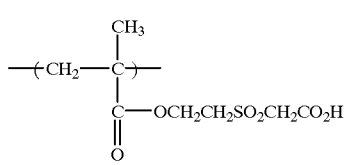

P-7

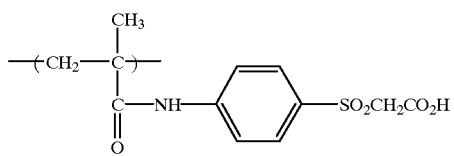

P-8

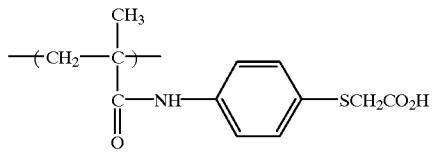

P-9

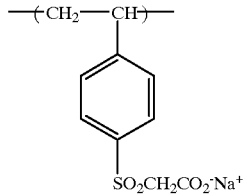

-continued

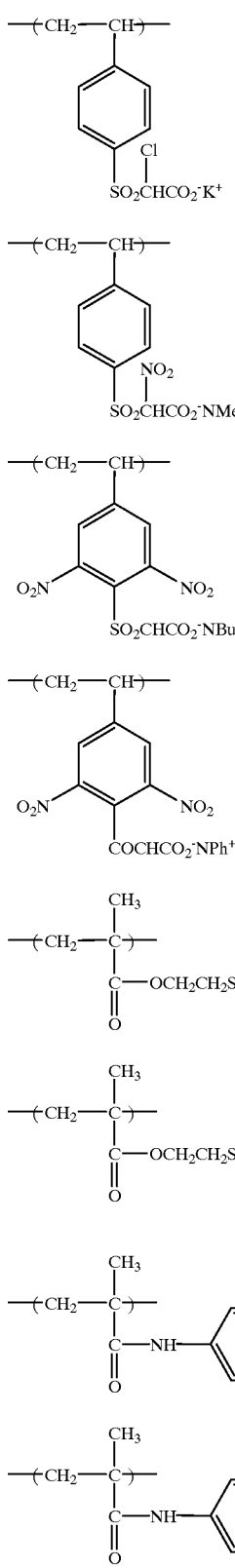

The proportion of the polarity-converting polymer compound in the image-forming layer of the lithographic printing plate precursor of the present invention is preferably from 0 to 94% by weight, more preferably from 0.05 to 90% by weight.

(Positive-Working Photosensitive Layer Composition)

As the positive-working photosensitive layer composition to be used herein there is preferably used any of the following conventional well-known positive-working photosensitive layer compositions (a) and (b).

(a) Conventional positive-working photosensitive composition comprising naphthoquinonediazide and a novolak resin which has been heretofore used.

(b) Chemically-amplified positive-working photosensitive composition comprising in combination an alkali-soluble compound protected by an acid-decomposable group and an acid generator.

The foregoing compositions (a) and (b) are well-known in the art. More preferably, these compositions are used in combination with the following positive-working sensitive compositions (c) to (e).

(c) Laser-sensitive positive-working composition comprising a sulfonic acid ester polymer and an infrared absorber which can provide a lithographic printing plate requiring no development disclosed in U.S. Pat. No. 6,017,677.

(d) Laser-sensitive positive-working composition comprising a carboxylic acid ester polymer and acid generator or infrared absorber which can provide a lithographic printing plate requiring no development disclosed in EP652483 and JP-A-6-502260.

(e) Laser-sensitive positive-working composition comprising an alkali-soluble compound and a thermally-decomposable material which substantially lowers the solubility of the alkali-soluble compound when it is undecomposed as disclosed in JP-A-11-95421.

(f) Alkali-developable elution positive-working composition comprising an infrared absorber, a novolak resin, and a dissolution inhibitor which can provide an alkali-developable elution type positive-working lithographic printing plate.

(Negative-Working Photosensitive Layer Composition)

As the negative-working photosensitive layer composition to be used herein there may be used any of the following conventional well-known negative-working sensitive compositions (g) to (j).

(g) Negative-working sensitive composition comprising a polymer containing photo-crosslinkable group and an azide compound.

(h) Negative-working sensitive composition comprising a diazo compound disclosed in JP-A-59-101651.

(i) Photopolymerizable negative-working sensitive composition comprising a photopolymerization initiator and an addition-polymerizable unsaturated compound disclosed in U.S. Pat. No. 262,276 and JP-A-2-63054.

(j) Negative-working sensitive composition comprising an alkali-soluble compound, an acid generator and an acid-crosslinkable compound disclosed in JP-A-11-95421.

Other Components

The image-forming layer of the lithographic printing plate precursor of the present invention may comprise various compounds incorporated therein besides the foregoing additives as necessary to obtain various properties of lithographic printing plate.

The image-forming layer of the lithographic printing plate precursor of the present invention may comprise a dye having a great absorption in the visible light range as an image colorant.

Specific examples of such a dye include Oil Yellow #101, Oil Yellow #103, Oil Pink #312, Oil Green BG, Oil Blue BOS, Oil Blue #603, Oil Black BY, Oil Black BS, Oil Black T-505 (produced by Orient Chemical Industries Limited), Victoria Pure Blue, Crystal Violet (CI42555), Methyl Violet (CI42535), Ethyl Violet, Rhodamine B (CI145170B), Malachite Green (CI42000), Methylene Blue (CI52015), and dye disclosed in JP-A-62-293247.

These dyes make it easy to distinguish between the image area and the non-image area after image formation. Therefore, these dyes are preferably added. The amount of such a dye to be added is from 0.01 to 10% by weight based on the total solid content of the image-forming layer.

The image-forming layer of the lithographic printing plate precursor of the present invention may comprise a nonionic surface active agent disclosed in JP-A-62-251740 and JP-A-3-208514 or an amphoteric surface active agent disclosed in JP-A-59-121044 and JP-A-4-13149 incorporated therein to increase the stability of processing to development conditions.

Specific examples of the nonionic surface active agent include sorbitan tristearate, sorbitan monopalmitate, sorbitan trioleate, monoglyceride stearate, and polyoxyethylene nonylphenyl ether.

Specific examples of the amphoteric surface active agent include alkyl di(aminoethyl)glycine, alkyl polyaminoethyglycine hydrochloride, 2-alkyl-N-carboxyethyl-N-hydroxyethylimidazolinium betaine, and N-tetradecyl-N,N-betaine (e.g., Amogen K, produced by Dai-ichi Kogyo Seiyaku Co., Ltd.). The proportion of the foregoing nonionic surface active agent and amphoteric surface active agent in the image-forming layer of the lithographic printing plate precursor is preferably from 0.05 to 15% by weight, more preferably from 0.1 to 5% by weight.

The image-forming layer of the lithographic printing plate precursor of the present invention may comprise a plasticizer incorporated therein as necessary to render the resulting coat layer flexible. Examples of the plasticizer employable herein include oligomer and polymer of polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, acrylic acid and methacrylic acid.

Besides these additives, the image-forming layer of the lithographic printing plate precursor may comprise the onium salt previously described, a haloalkyl-substituted s-triazine, an epoxy compound, a vinylether, or phenol compound containing hydroxymethyl group or alkoxymethyl group disclosed in The image-forming layer of the present invention can be formed by dissolving the foregoing various components in a solvent, and then applying the solution on a crosslinked hydrophilic layer. Examples of the solvent employable herein include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene, and water. However, the present invention is not limited to these solvents. These solvents may be used singly or in admixture. The concentration of the foregoing components (all solid content, including additives) in the solvent is preferably from 1 to 50% by weight. The coated amount (solid content) on the hydrophilic layer which has been dried depends on the purpose. In practice, however, it is from 0.1 $g/m^2$ to 10 $g/m^2$, preferably from 0.5 $g/m^2$ to 5 $g/m^2$. When the coated amount is too small, the resulting lithographic printing plate precursor exhibits a low press life. On the contrary, when the coated amount is too great, the resulting lithographic printing plate precursor provides printed matters having deteriorated reproducibility of tine lines. JP-A-8-276558 incorporated therein.

The application of the image-forming layer coating solution can be accomplished by various methods. Examples of the coating method employable herein include bar coater method, rotary coating method, spray coating method, curtain coating method, dip coating method, air knife coating method, blade coating method, and roll coating method. The less the coated amount is, the greater is the apparent sensitivity, but the poorer are the properties of the image-forming layer.

The image-forming layer of the lithographic printing plate precursor of the present invention may comprise a surface active agent for improving the coatability thereof, e.g., fluorine-based surface active agent disclosed in JP-A-62-170950 incorporated therein. The amount of such a surface active agent to be added is preferably from 0.01 to 1% by weight, more preferably from 0.05 to 0.5% by weight based on the total solid content of the image-forming layer.

The support to be used herein is not specifically limited. In practice, however, a dimensionally stable flat material may be used. Examples of such a support include paper, paper laminated with a plastic (e.g., polyethylene terephthalate, polyethylene, polypropylene, polystyrene), metal plate (e.g., aluminum, zinc, copper), plastic film (e.g., cellulose diacetate, cellulose triacetate, cellulose propionate, cellulose butyrate, cellulose acetobutyrate, cellulose nitrate, polyethylene terephthalate, polyethylene, polystyrene, polypropylene, polycarbonate, polyvinyl acetal), and paper or plastic film having the foregoing metal vacuum-deposited or laminated thereon.

Preferred among these support materials are polyester film and aluminum plate.

Suitable aluminum plates employable herein include a pure aluminum plate and a plate of aluminum-based alloys containing small amounts of foreign elements. Aluminum-laminated or deposited plastic films are also preferred. The foreign elements providing aluminum alloys include silicon, iron, manganese, copper, magnesium, chromium, zinc, bismuth, nickel, and titanium. The content of these foreign elements in the alloy is about 10% by weight or less. The most ideal aluminum support for use in the present invention is a pure aluminum plate. Since 100% pure aluminum is difficult to produce with the conventional refining techniques, nearly pure aluminum with a trace of foreign elements will do. Thus, the aluminum plate to be used in the present invention is not particularly limited by composition, and aluminum plates made of conventional well-known materials can be utilized appropriately. The thickness of the support which can be used in the present invention is usually about 0.1 to 0.6 mm, preferably 0.15 to 0.4 mm, still more preferably 0.2 to 0.8 mm.

In the case where as the crosslinked hydrophilic layer there is used a hydrophilic polymer which undergoes crosslinking when irradiated with light, particularly a graft polymer having a double bond, when a material having a photo-crosslinkable group (unsaturated group) is used also as a support, the foregoing polymer and the substrate are covalently bonded to each other upon photo-crosslinking, assuring the adhesion between the support and the hydrophilic layer. The use of such a support makes it possible to drastically improve the press life of the resulting lithographic printing plate precursor.

Description of Surface of Support Having Unsaturated Group

In order to prepare the surface of a support having an unsaturated group, a liquid composition (sol) containing a compound having an unsaturated group (silane coupling agent, etc.) is applied to an aluminum support, and then dried to prepare a substrate having an unsaturated group retained on the surface of the support. The use of the foregoing support substrate makes it possible to allow the radical-polymerizable group (unsaturated group) in the crosslinked hydrophilic layer and the unsaturated group in the surface of the support substrate to undergo photopolymerization reaction and hence chemical bonding.

The term "surface of support" as used herein is meant to indicate the surface suitable for chemical bonding of a hydrophilic polymer compound chain having a radical-polymerizable group in its side chain. This surface of support may be in any form so far as it can function as defined above. This surface of support may be a layer separately provided on the support of the lithographic printing plate precursor of the present invention.

(Sol)

In general, there is preferably used a sol-gel process (hereinafter referred to as "SG process") involving the use of an organic-inorganic complex having an addition-reactive functional group fixed to an inorganic polymer containing —Si—O—Si— bond obtained by the hydrolysis and polycondensation of a silane coupling agent. For the details of SG process, reference canbemade to Yoshio Imai, "Yuki Keiso Porima no saishin gijutsu (Modern technology of organic silicon polymer): Chapter 6; Zoru-geru ho to keisokei koubunshi no kenkyu doukou (Trend of study of sol-gel process and silicon polymers)", CMC, 1996, and Sumio Sakuhana, "Zoru-geru ho no kagaku (Science of sol-gel process)", Agne Shofusha, 1988. However, the present invention is not limited to these references.

SG process is preferably used because the distribution of addition-reactive functional group bonded and fixed to the surface of the support can be little governed by the distribution of chemical properties such as acid point and base point on the surface of the support.

Examples of the silane coupling agent employable herein include a compound represented by formula (2):

wherein at least two of Ra to Rd each represent an alkoxy group having 10 or less carbon atoms or —OCOR' group in which R' represents an alkyl group and the other represents an addition-polymerizable (reation) group.

Examples of the alkyl group represented by R' in the formula (2) include methyl group, ethyl group, and propyl group. Examples of the addition-polymerizable (reation) group represented by Ra to Rd include alkenyl group, and alkinyl group. The Si element and these addition-polymerizable groups may be connected to each other via various connecting groups. Examples of the alkenyl group include vinyl group, propenyl group, allyl group, butenyl group, and dialkylmaleimide group. Examples of the alkinyl group include acetylene group, and alkylacetylene group. However, the present invention is not limited to these compounds.

Examples of the silane coupling agent employable herein include those disclosed in Edwin P. Plueddemann, "Silane Coupling Agents", Plenum Press, 1982.

Specific examples of these silane coupling agents include tetramethoxysilane, tetraethoxysilane, tetraisopropoxysilane, tetra(n-propoxy)silane, tetra(n-butoxy)silane, tetrakis(2-ethylbutoxy)silane, tetrakis(2-ethylhexyloxy)silane, tetrakis(2-methoxyethoxy)silane, tetraphenoxysilane, and tetraacetoxysilane. Particularly preferred among these silane coupling agents is tetraethoxysilane.

(Light-to-Heat Converting Material)

In the case where the lithographic printing plate precursor of the present invention is subjected to scanning exposure to laser beam such as IR laser beam to effect image recording, a light-to-heat converting material for converting the optical energy to heat energy is preferably incorporated in any portion of the lithographic printing plate precursor. The portion of the lithographic printing plate precursor in which the light-to-heat converting material is incorporated may be the image-forming layer, the crosslinked hydrophilic layer, the surface layer of the support, any layer between the image-forming layer and the crosslinked hydrophilic layer, or any layer between the surface layer of the support and the support.

As the light-to-heat converting material to be incorporated in the lithographic printing plate precursor of the present invention there may be used any material capable of absorbing light such as ultraviolet ray, visible light, infrared light and white light and then converting it to heat. Examples of such a light-to-heat converting material include carbon black, carbon graphite, pigment, phthalocyanine pigment, iron powder, graphite powder, iron oxide powder, lead oxide, silver oxide, chromium oxide, iron sulfate, and chromium sulfate. Particularly preferred examples of the light-to-heat converting material include dyes, pigment and metals which absorb effectively infrared light having a wavelength of from 760 nm to 1,200 nm.

Examples of the dye employable herein include commercially available dyes, and well-known dyes described in literatures (e.g., "Senryou Binran (Handbook of Dyes)", The Society of Synthetic Organic Chemistry, Japan, 1970. Specific examples of these dyes include azo dye, metal complex salt-azo dye, pyrazolone azo dye, anthraquinone dye, phthalocyanine dye, carbonium dye, quinoneimine dye, methine dye, cyanine dye, and metal-thiolate complex. Preferred examples of these dyes include cyanine dyes disclosed in JP-A-58-125246, JP-A-59-84356, JP-A-59-202829, and JP-A-60-78787, methine dyes disclosed in JP-A-58-173696, JP-A-58-181690, and JP-A-58-194595, naphthoquinone dyes disclosed in JP-A-58-112793, JP-A-58-224793, JP-A-59-48187, JP-A-59-73996, JP-A-60-52940, and JP-A-60-63744, squarylium dyes disclosed in JP-A-58-112792, and cyanine dyes disclosed in British Patent 434,875.

As the dye there may be preferably used a near infrared-absorbing sensitizer disclosed in U.S. Pat. No. 5,156,938. Particularly preferred examples of the dye employable herein include substituted arylbenzo(thio)pyrylium salts disclosed in U.S. Pat. No. 3,881,924, trimethine thiapyrylium salts disclosed in JP-A-57-142645 (corresponding to U.S. Pat. No. 4,327,169), pyrylium-based compounds disclosed in JP-A-58-181051, JP-A-58-220143, JP-A-59-41363, JP-A-59-84248, JP-A-59-84249, JP-A-59-146063, and JP-A-59-146061, cyanine dyes disclosed in JP-A-59-216146, pentamethine thiopyrylium salts disclosed in U.S. Pat. No. 4,283,475, and pyrylium compounds disclosed in JP-B-5-13514 and JP-B-5-19702. Other preferred examples of the dye employable herein include near infrared-absorbing dyes described as those of the general formulae (I) and (II) in U.S. Pat. No. 4,756,993. Particularly preferred among these dyes are cyanine dye, squarylium dye, pyrylium salt, and nickel-thiolate complex.

Examples of the pigment employable herein include commercially available pigments, andpigments described in Color Index (C.I.) Handbook, "Saishin Ganryou Binran (Handbook of Modern Pigments)", Nihon Ganryou Gijutsu Kyoukai, 1977, "Saishin Ganryou Ouyou Gijutsu (Modern Technology of Application of Pigments)", CMC, 1986, and "Insatsu Inki Gijutsu (Printing Ink Technology)", CMC, 1984. Examples of the kind of the pigment employable herein include black pigment, yellow pigment, orange pigment, brown pigment, red pigment, violet pigment, blue pigment, green pigment, fluorescent pigment, metal powder pigment, and polymer bond dye. Specific examples of these pigments include insoluble azo pigment, azo lake pigment, condensed azo pigment, chelate azo pigment, phthalocyanine pigment, anthraquinone pigment, perylene pigment, perynone pigment, thioindigo pigment, quinacridone pigment, dioxazine pigment, isoindolinone pigment, quinophthalone pigment, dyed lake pigment, azine pigment, nitroso pigment, natural pigment, fluorescent pigment, inorganic pigment, and carbon black. Among these, carbon black is preferred.

These pigments may or may not be subjected to surface treatment before use. Proposed examples of surface treatment method include a method involving the coating of the surface of pigment with a resin or wax, a method involving the attachment of a surface active agent to the surface of pigment, and a method involving the bonding of a reactive material (e.g., silane coupling agent, epoxy compound, polyisocyanate compound) to the surface of pigment. These surface treatment methods are further described in "Kinzoku Sekken no Seishitsu to Ouyou (Properties and Application of Metallic Soap)", Saiwai Shobo, "Insatsu Inki Gijutsu (Printing Ink Technology)", CMC, 1984 and "Saishin Ganryo Ouyou Gijutsu (Modern Technology of Application of Pigments) CMC, 1986.

The particle diameter of the pigment is preferably from 0.01 $\mu$m to 1 $\mu$m, more preferably from 0.05 $\mu$m to 1 $\mu$m, particularly from 0.1 $\mu$m to 1 $\mu$m. When the particle diameter of the pigment is less than 0.01 $\mu$m, it is disadvantageous in the stability of the dispersion in the light-to-heat converting material-containing layer coating solution. On the contrary, when the particle diameter of the pigment exceeds 10 $\mu$m, it is disadvantageous in the uniformity of the light-to-heat converting material-containing layer. As a method for dispersing the pigment there may be used any well-known dispersion method for use in the preparation of ink or toner. Examples of dispersing machines employable herein include ultrasonic dispersing machine, sand mill, attritor, pearl mill, super mill, ball mill, impeller, disperser, KD mill, colloid mill, dynatron, three-roll mill, and pressure kneader. These dispersing machines are further described in "Saishin Ganryou Ouyou Gijutsu (Modern Technology of Application of Pigments)", CMC, 1986.

These dyes or pigments may be used in an amount of from 0.01 to 50% by weight, preferably from 0.1 to 10% by weight, particularly from 0.5 to 10% by weight for dye or from 3.1 to 10% by weight for pigment, based on the total solid content of the light-to-heat converting material-containing layer. When the amount of the pigment or dye to be added is less than 0.01% by weight, the resulting lithographic printing plate precursor exhibits a lowered sensitivity. On the contrary, when the amount of the pigment or dye to be added exceeds 50% by weight, the resulting light-to-heat converting material-containing layer exhibits a lowered strength.

A particularly preferred example of the light-to-heat converting material to be incorporated in the lithographic printing plate precursor of the present invention is a dye. In particular, the polymer containing as the hydrophilic group in the polymer of the hydrophilic layer an acidic group such as carboxylic acid, sulfonic acid and phosphonic acid preferably comprises a basic dye incorporated therein. The polymer containing a hydrophilic group such as ammonium salt group preferably comprises an acidic dye incorporated therein.

(Thickness of Image-Forming Layer)

The thickness of the foregoing image-forming layer is from 0.5 to 5.0 g/m$^2$, preferably from 1.0 to 3.0 g/m$^2$. When the thickness of the foregoing image-forming layer is less than 0.5 g/m$^2$, the effect of hydrophilicity cannot be exerted. On the contrary, when thickness of the foregoing image-forming layer exceeds 5.0 g/m$^2$, the resulting image-forming layer exhibits a reduced sensitivity and strength to disadvantage.

(Other Requirements, Coating Solvent, Support, etc.)

The lithographic printing plate precursor of the present invention can be normally prepared by dissolving the various components of the crosslinked hydrophilic layer (image-forming layer) in a solvent, applying the coating solution to a proper support, and then allowing the material to undergo crosslinking. Examples of the solvent employable herein include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, y-butyrolactone, toluene, and water. However, the present invention is not limited to these solvents. These solvents may be used singly or in admixture. The concentration of the foregoing components (all solid content, including additives) in the solvent is preferably from 1 to 50% by weight. The coated amount (solid content) on the hydrophilic layer which has been dried depends on the purpose. In practice, however, it is normally preferably from 0.5 g/m$^2$ to 5.0 g/m$^2$ for lithographic printing plate precursor. The application of the image-forming layer coating solution can be accomplished by various methods. Examples of the coating method employable herein include bar coater method, rotary coating method, spray coating method, curtain coating method, dip coating method, air knife coating method, blade coating method, and roll coating method.

The crosslinked hydrophilic layer of the present invention may comprise a surface active agent for improving the coatability thereof, e.g., fluorine-based surface active agent disclosed in JP-A-62-170950 incorporated therein. The amount of such a surface active agent to be added is preferably from 0.01 to 1% by weight, more preferably from 0.05 to 0.5% by weight based on the total solid content of the crosslinked hydrophilic layer.

The support to be used herein is preferably a dimensionally stable flat material. Examples of such a support include paper, paper laminated with a plastic (e.g., polyethylene, polypropylene, polystyrene), metalplate (e.g., aluminum, zinc, copper), plastic film (e.g., cellulose diacetate, cellulose triacetate, cellulose propionate, cellulose butyrate, cellulose acetobutyrate, cellulose nitrate, polyethylene terephthalate, polyethylene, polystyrene, polypropylene, polycarbonate, polyvinyl acetal), and paper or plastic film having the foregoing metal vacuum-deposited or laminated thereon. Preferred among these support materials are polyester film and aluminum plate. Particularly preferred among these support materials is aluminum plate, which has a good dimensional stability and is relatively inexpensive. Suitable aluminum plates employable herein include a pure aluminum plate and a plate of aluminum-based alloys containing small amounts of foreign elements. Aluminum-laminated or deposited plastic films are also preferred. The foreign elements providing aluminum alloys include silicon, iron, manganese, copper, magnesium, chromium, zinc, bismuth, nickel, and titanium. The content of these foreign elements in the alloy is about 10% by weight or less. The most ideal aluminum support for use in the present invention is a pure aluminum plate. Since 100% pure aluminum is difficult to produce with the conventional refining techniques, nearly pure aluminum with a trace of foreign elements will do. Thus, the aluminum plate to be used in the present invention is not particularly limited by composition, and aluminum plates made of conventional well-known materials can be utilized appropriately. The thickness of the support which can be used in the present invention is usually about 0.1 to 0.6 mm, preferably 0.15 to 0.4 mm, still more preferably 0.2 to 0.3 mm.

In the case where as the crosslinked hydrophilic layer there is used a hydrophilic polymer which undergoes crosslinking when irradiated with light, particularly a graft polymer having a double bond, when a material having a photo-crosslinkable group (unsaturated group) is used also as a support, the foregoing polymer and the substrate are covalently bonded to each other upon photo-crosslinking, assuring the adhesion between the support and the hydrophilic layer. The use of such a support makes it possible to drastically improve the press life of the resulting lithographic printing plate precursor.

Description of Surface of Support Having Unsaturated Group

In order to prepare the surface of a support having an unsaturated group, a liquid composition (sol) containing a compound having an unsaturated group (silane coupling agent, etc.) is applied to an aluminum support, and then dried to prepare a substrate having an unsaturated group retained on the surface of the support. The use of the foregoing support substrate makes it possible to allow the radical-polymerizable (photo-crosslinkable) group in the crosslinked hydrophilic layer and the unsaturated group in the surface of the support substrate to undergo photopolymerization reaction and hence chemical bonding.

The term "surface of support" as used herein is meant to indicate the surface suitable for chemical bonding of a hydrophilic polymer compound chain having a radical-polymerizable group in its side chain. This surface of support may be in any form so far as it can function as defined above. This surface of support may be a layer separately provided on the support of the lithographic printing plate precursor of the present invention.

(Sol)

In general, there is preferably used a sol-gel process (hereinafter referred to as "SG process") involving the use of an organic-inorganic complex having an addition-reactive functional group fixed to an inorganic polymer containing —Si—O—Si— bond obtained by the hydrolysis and polycondensation of a silane coupling agent. For the details of SG process, reference can be made to Yoshio Imai, "Yuki Keiso Porima no saishin gijutsu (Modern technology of organic silicon polymer): Chapter 6; Zoru-geru ho to keisokei koubunshi no kenkyu doukou (Trend of study of sol-gel process and silicon polymers)", CMC, 1996, and Sumio Sakuhana, "Zoru-geru ho no kagaku (Science of sol-gel process)", Agne Shofusha, 1988. However, the present invention is not limited to these references.

SG process is preferably used because the distribution of addition-reactive functional group bonded and fixed to the surface of the support can be little governed by the distribution of chemical properties such as acid point and base point on the surface of the support.

Examples of the silane coupling agent employable herein include a compound represented by formula (1):

wherein at least two of Ra to Rd each represent an alkoxy group having 10 or less carbon atoms or —OCOR' group in which R' represents an alkyl group and the other represents an addition-polymerizable (reaction) group.

Examples of the alkyl group represented by R' in the general formula (1) include methyl group, ethyl group, and propyl group. Examples of the addition-polymerizable (reaction) group represented by Ra to Rd include alkenyl group, and alkinyl group. The Si element and these addition-polymerizable groups may be connected to each other via various connecting groups. Examples of the alkenyl group include vinyl group, propenyl group, allyl group, butenyl group, and dialkylmaleimide group. Examples of the alkinyl group include acetylene group, and alkylacetylene group. However, the present invention is not limited to these compounds.

Examples of the silane coupling agent employable herein include those disclosed in Edwin P. Plued demann, "Silane Coupling Agents", Plemum Press, 1982.

Specific examples of these silane coupling agents include tetramethoxysilane, tetraethoxysilane, tetraisopropoxysilane, tetra(n-propoxy)silane, tetra(n-butoxy)silane, tetrakis(2-ethylbutoxy)silane, tetrakis(2-ethylhexyloxy)silane, tetrakis(2-methoxyethoxy)silane, tetraphenoxysilane, and tetraacetoxysilane. Particularly preferred among these silane coupling agents is tetraethoxysilane.

EXAMPLE

The present invention will be further described in the following examples, but the present invention should not be construed as being limited thereto.

Example of Synthesis of Polymer of the Present Invention (1):

(Synthesis of Hydrophilic Macromer and Amide Macromonomer)

30 g of acrylamide and 3.8 g of 3-mercaptopropionic acid were dissolved in 70 g of ethanol. In a nitrogen atmosphere, the solution thus obtained was heated to a temperature of 60° C. To the solution was then added 300 mg of AIBN. The reaction mixture was then reacted for 6 hours. After the termination of the reaction, the resulting white precipitate was filtered, and then thoroughly washed with methanol to obtain 30.8 g of a carboxylic acid-terminated prepolymer.

20 g of the prepolymer thus obtained was then dissolved in 62 g of dimethyl sulfoxide. To the solution were then added 6.71 g of glycidyl methacrylate, 504 mg of N,N-dimethyldodecylamine (catalyst) and 62.4 mg of hydroquinone (polymerization inhibitor). The reaction mixture was then reacted at a temperature of 140° C. in a nitrogen atmosphere for 7 hours. The reaction solution was then added to acetone to cause the precipitation of a polymer. The polymer thus obtained was then thoroughly washed to obtain 23.4 g of a methacrylate-terminated acrylamide macromonomer (weight-average molecular weight: 1,400).

(Synthesis of Graft Polymer (1) from Hydrophilic Macromer)

To 5 g of distilled water in a flask was added dropwise an aqueous solution obtained by dissolving 4 g of the foregoing macromonomer, 6 g of methacrylic acid and 100 mg of potassium persulfate in 17 g of distilled water at a temperature of 65° C. in a nitrogen atmosphere in 2 hours. After the termination of dropwise addition, the reaction mixture was further heated for 6 hours. The reaction solution was then added to acetone to cause the precipitation of a polymer. The polymer thus obtained was then thoroughly washed to obtain 9.5 g of a methacrylic acid-grafted acrylamide polymer.

(Synthesis of Graft Polymer (1) Having Photo-Crosslinkable Group)

9 g of the foregoing graft polymer was dissolved in 200 g of DMAC. To the solution thus obtained were then added 0.41 g of hydroquinone, 5 g of 2-methacryloyloxyethyl isocyanate and 0.15 g of dibutyltin dilaurate. The reaction mixture was then reacted at a temperature of 65° C. for 5 hours. After the termination of the reaction, the reaction solution was cooled. The carboxyl group in the reaction solution was then neutralized with a 1N aqueous solution of potassium hydroxide. The reaction solution was then added to ethyl acetate to cause the precipitation of a polymer. The polymer was then thoroughly washed to obtain the desired polymer (yield: 13 g).

Example of Synthesis of Polymer Having Photo-Crosslinkable Group (2):

A hydrophilic macromer was synthesized in the same manner as in the foregoing synthesis example (1) except that as the monomer there was used N-vinylacetamide instead of acrylamide. The hydrophilic macromer thus obtained was then processed in the same manner as in the foregoing synthesis example (1) to synthesize a graft polymer (2) having a photo-crosslinkable group.

Example of Synthesis of Polymer Having Photo-Crosslinkable Group (3):

A graft polymer was synthesized in the same manner as in the foregoing synthesis example (1) except that as the hydrophilic macromer there was used a methacrylate having a polyethylene oxide chain (methoxy polyethylene glycol monomethacrylate; Blenmer PME400; number-average molecular weight: 4,000, produced by NOF CORPORATION). The graft polymer was then processed in the same manner as in the foregoing synthesis example (1) to obtain a graft polymer having a photo-crosslinkable group (3).

Examples I-1–I-3

(Process for the Preparation of Sol-Gel-Containing Support)

An aluminum plate having a thickness of 0.30 mm was grained on the surface thereof with a nylon brush and an aqueous suspension of 400 mesh pumice, and then thoroughly washed with water. The aluminum plate thus grained was dipped in a 100% aqueous solution of sodium hydroxide at a temperature of 70° C. for 60 seconds so that it was etched, washed with flowing water, neutralized and washed with a 20 wt-% nitric acid, and then washed with water. The aluminum plate thus etched was then electrolytically roughened with ac sinusoidal current at an anodization electricity of 160 coulomb/dm$^2$ and $V_A$ of 12.7 V in a 1 wt-% aqueous solution of nitric acid. The aluminum plate thus roughened was then measured for surface roughness. The results were 0.6 μm (Ra). Subsequently, the aluminum plate was dipped in a 30 wt-% aqueous solution of sulfuric acid where it was then desmutted at a temperature of 55° C. for 2 minutes. The aluminum plate thus desmutted was then anodized at a current density of 2A/dm$^2$ in a 20 wt-% aqueous solution of sulfuric acid for 2 minutes in such a manner that the thickness of the anodic oxidation film reached 2.7 g/m$^2$.

A sol-gel process liquid composition (sol) was prepared in the following manner.

| (Sol) | |
|---|---|
| Methanol | 130 g |
| Water | 20 g |
| 80 wt-% phosphoric acid | 16 g |
| Tetraethoxysilane | 50 g |
| 3-Methacryloxypropyl trimethoxysilane | 60 g |

These sol components were mixed and stirred. In about 5 minutes, heat generation was recognized. The mixture was reacted for 60 minutes, and then transferred to another vessel. To the mixture was then added 3,000 g of methanol to obtain a sol. The sol thus obtained was diluted with a 9/1 (by weight) mixture of methanol and ethylene glycol, applied to the support in such an amount that the amount of Si reached 3 mg/m$^2$, and then dried at a temperature of 100° C. for 1 minute to prepare an aluminum support substrate.

In Example I-1, the following composition was applied to the foregoing aluminum support substrate in a coated amount of 1.7 g/m$^2$, dried at a temperature of 100° C. for 2 minutes, and then exposed to UV to prepare a lithographic printing plate precursor.

(Image-Forming Layer Coating Solution)

| | |
|---|---|
| Graft polymer having photo-crosslinkable group (1) (as described above) | 1.0 g |
| Photopolymerization initiator A (having the following structure) | 0.1 g |
| Light-to-heat converting agent B (having the following structure) | 0.14 g |
| 20 wt-% Aqueous dispersion of heat-fusible particulate polystyrene stabilized with surface active agent (1.5 wt-% based on polymer) | 1.45 g |
| Distilled water | 12.7 g |
| Acetonitrile | 6.4 g |

Polymerization Initiator A

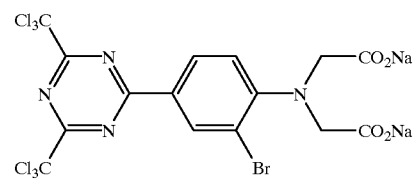

Light-to-Heat Converting Agent B

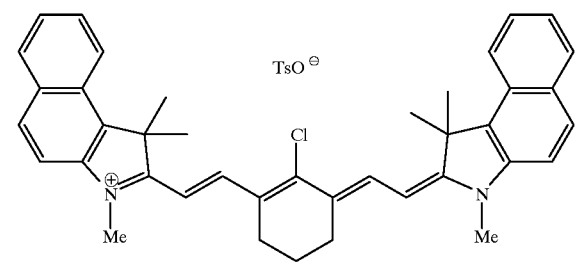

Evaluation of Print

The lithographic printing plate precursor thus obtained was imagewise exposed to laser beam having a wavelength of 830 nm and a diameter of 25 μm from a semiconductor laser through a 1,751 pi halftone image at a main scanning rate of 3 m/sec. The printing plate thus exposed was then subjected to printing using a Heidel KOR-D printing machine without development processing.

Examples I-2 and I-3 were made in the same manner as in Example I-1 except that the graft polymer having a photo-crosslinkable group (1) to be incorporated in the image-forming layer coating solution was replaced by the graft polymer having a photo-crosslinkable group (2) (as described above) in Example I-2 and the graft polymer having a photo-crosslinkable group (3) (as described above) in Example I-3.

All the lithographic printing plate precursors of these examples provided 3,000 or more sheets of printed matters free of stain on the non-image area with satisfactory results.

As described above, the lithographic printing plate precursor of the present invention has a hydrophilic group incorporated as a graft chain in the polymer main chain of the crosslinked structure in the crosslinked hydrophilic layer and thus exhibits a high hydrophilicity. In this arrangement, the lithographic printing plate precursor of the present invention exhibits a good press life under even severe printing conditions and thus provides printed matters free of stain on the non-image area.

By incorporating heat-fusible hydrophobic particles, a light-to-heat converting material, etc. in the matrix of the crosslinked hydrophilic layer, the surface of the crosslinked hydrophilic layer is rendered hydrophobic when acted upon by heat or irradiated with radiations, allowing the formation of an image by scanning exposure to laser beam in a short period of time. Accordingly, a negative-working lithographic printing plate precursor which can be subjected to simple water development to effect plate making or can be mounted without development processing on the printing machine to effect plate making can be provided.

Examples II-1–II-3

(Positive-Working Photosensitive Lithographic Printing Plate Precursor)

(Process for the Preparation of Sol-Gel-Containing Support)

An aluminum support substrate was prepared in the same manner as in Examples I-1 to I-3.

(Crosslinked Hydrophilic Layer)

In Examples II-1 to II-3, the coating solutions having the following formulations were applied to the foregoing aluminum support substrate in an amount such that the coated amount reached 1.7 g/m², dried at a temperature of 100° C. for 2 minutes, and then exposed to UV to form the respective crosslinked hydrophilic layer.

(Crosslinked Hydrophilic Layer of Example II-1: Coating Solution (1))

| | |
|---|---|
| Graft polymer having photo-crosslinkable group (1) (as described above) | 1.0 g |
| Photopolymerization initiator A having the following structure | 0.1 g |
| Distilled water | 13 g |
| Acetonitrile | 7 g |

(Crosslinked Hydrophilic Layer of Example II-2: Coating Solution (2))

| | |
|---|---|
| Graft polymer having photo-crosslinkable group (2) (as described above) | 1.0 g |
| Photopolymerization initiator A having the following structure | 0.1 g |
| Distilled water | 13 g |
| Acetonitrile | 7 g |

(Crosslinked Hydrophilic Layer of Example II-3: Coating Solution (3))

| | |
|---|---|
| Graft polymer having photo-crosslinkable group (3) (as described above) | 1.0 g |
| Photopolymerization initiator A having the following structure | 0.1 g |
| Distilled water | 13 g |
| Acetonitrile | 7 g |

Polymerization Initiator A

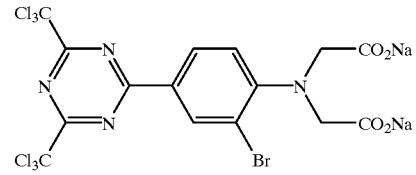

(Image-Forming Layer; Sulfonic Acid Ester-Based)

A composition consisting of 0.4 g of the foregoing specific example (1p-4) of sulfonic acid ester polymer, 50 mg of IRG (IR dye produced by NIPPON KAYAKU CO., LTD.) and 4.0 g of methyl ethyl ketone was applied to each of the foregoing crosslinked hydrophilic layers (1), (2) and (3) using a rod bar #15, and then dried at a temperature of 80° C. for 55 minutes to obtain positive-working lithographic printing plate precursors A, B and C.

The positive-working lithographic printing plate precursors A, B and C were each exposed to light using Pearl Setter (908 nm IR laser, produced by Presstek; output: 1.2 w; main scanning speed: 2 M/sec), and then mounted untreated on the printing machine for printing. As the printing machine there was used Ryoubi 3200. As a fountain solution there was used one obtained by diluting EU-3 (produced by Fuji Photo Film Co., Ltd.) by a factor of 100. As an ink there was used Ink F Gloss Black. All these positive-working lithographic printing plate precursors provided clear printed matters free of stain even up to 2,000 sheets.

Example II-4

(Negative-Working Heat-Sensitive Lithographic Printing Plate Precursor)

As a support and a crosslinked hydrophilic layer there were used the same materials as used in Example II-1. The procedure of Example II-1 was followed except that as the heat-sensitive layer composition which constitutes an image-forming layer there was used p-1 instead of 1p-2 and as the solvent there was used methanol instead of methyl ethyl ketone to prepare a negative-working photosensitive lithographic printing plate precursor which was then subjected to scanning exposure and evaluation for printing properties.

Example II-5
(Positive-Working Photosensitive Lithographic Printing Plate Precursor)

As a support and a crosslinked hydrophilic layer there were used the same materials as used in Example II-1.
(Formulation of Image-Forming Layer)
(Alkali-Soluble Polymer: Naphthoquinone-1,2-diazide-based (Conventional Positive-Working))

A coated material obtained by applying a composition comprising 0.9 g of an esterification product of naphthoquinone-1,2-diazide-4-sulfonyl chloride with pyrogallol 1-acetone resin, 0.05 g of victoria pure blue BOH, 2.0 g of a novolak resin obtained from cresol and formaldehyde (meta-para ratio: 6:4; weight-average molecular weight: 1,800), 20 g of methyl ethyl ketone and 7 g of methyl alcohol to the foregoing crosslinked hydrophilic layer was used as the positive-working lithographic printing plate precursor of Example II-5.

The positive-working lithographic printing plate precursor of Example II-5 thus obtained was exposed to PS light through a step guide produced by Fuji Photo Film Co., Ltd., and then passed through an automatic developing machine loaded with a Type DP-4 (1:8) developer (produced by Fuji Photo Film Co., Ltd.). Subsequently, the positive-working lithographic printing plate precursor thus developed was mounted on a Heidel KOR-D printing machine for printing. As a result, 4,000 sheets of good printed matters free of stain on the non-image area were obtained.

Example II-6
(Negative-Working Heat-Sensitive Lithographic Printing Plate Precursor)

As a support and a crosslinked hydrophilic layer there were used the same materials as used in Example II-1. A negative-working photosensitive lithographic printing plate precursor was prepared in the same manner as in Example II-1 except that the heat-sensitive layer which is an image-forming layer was formed by applying a composition having the following formulation. The negative-working photosensitive lithographic printing plate precursor thus prepared was then exposed to light, developed and evaluated for printing properties.
(Formulation of Image-Forming Layer)

A coated material obtained by applying a composition comprising 0.1 g of IRG22 (IR dye produced by NIPPON KAYAKU CO., LTD.), 0.21 g of a crosslinking agent A (hexamethoxymethyl compound of 1-[α-methyl-α-(4-hydroxyphenyl)ethyl]-4-[α, α-bis(4-hydroxyphenyl)ethyl] benzene), 2.1 g of phenol-formaldehyde novolak (weight-average molecular weight: 12,000), 0.02 g of diphenyliodonium-9,10-dimethoxyanthracene sulfonate, 0.06 g of Megafac F-176 (fluorine-based surface active agent produced by DAINIPPON INK & CHEMICALS, INC.), 15 g of methyl ethyl ketone and 12 g of 2-methoxy-1-propanol to the same support as used in Example II-1 was used as the negative-working heat-sensitive lithographic printing plate precursor of Example II-6.

The negative-working lithographic printing plate precursor of Example II-6 thus obtained was then exposed to light using a semiconductor laser as a heat mode laser (wavelength: 825 nm; beam diameter: $1/e^2=6$ μm) with its output being adjusted to 110 mW at the surface of the printing plate when the linear velocity is 8 m/sec. The negative-working lithographic printing plate precursor thus exposed was subjected to heat treatment at a temperature of 110° C. for 1 minute, and then passed through an automatic developing machine loaded with a Type DP-4 developer (1:8) (produced by Fuji Photo Film Co., Ltd.) and a Type FR-3 rinsing solution (1:7) (produced by Fuji Photo Film Co., Ltd.) for processing. Subsequently, the surface of the printing plate was treated with a Type GU-7 gum (1:1) (produced by Fuji Photo Film Co., Ltd.). The printing plate was then mounted on a Heidel KOR-D printing machine for printing. As a result, 6,000 sheets of good printed matters free of stain on the non-image area were obtained.

Subsequently, the negative-working lithographic printing plate of Example II-6 was stored at a temperature of 45° C. and a relative humidity of 75%, and then processed in the same manner as described above. As a result, good printed matters free of stain on the non-image area were obtained similarly. The number of sheets of good printed matters thus obtained was 5,000.

All the lithographic printing plate precursors of examples according to the present invention provided 2,000 or more sheets of good printed matters free of stain on the non-image area with satisfactory results.

As described above, the lithographic printing plate precursor of the present invention has a hydrophilic group incorporated as a graft chain in the polymer main chain of the crosslinked structure in the crosslinked hydrophilic layer and thus exhibits a high hydrophilicity. In this arrangement, the lithographic printing plate precursor of the present invention provides printed matters free of stain on the non-image area even under severe printing conditions.

By forming an image-forming layer (sensitive layer) containing a polymer compound having a functional group (polarity-converting group) which changes its hydrophilicity or hydrophobicity when acted upon by heat or acid or irradiated with radiations, the formation of an image by scanning exposure to laser beam or the like in a short period of time is made possible. Accordingly, a positive- or negative-working lithographic printing plate precursor which can be subjected to simple water development to effect plate making or can be mounted without development processing on the printing machine to effect plate making can be provided.

While the present invention has been described in detail and with reference to specific embodiments thereof, it will be apparent to one skilled in the art that various changes and modifications can be made therein without departing from the spirit and scope thereof.

What is claimed is:

1. A lithographic printing plate precursor comprising a crosslinked hydrophilic layer comprised of a crosslinked graft-copolymerized polymer of a hydrophilic macromer, provided on a support.

2. The lithographic printing plate precursor as claimed in claim 1, wherein said crosslinked hydrophilic layer contains a compound which renders the surface of said crosslinked hydrophilic layer hydrophobic when acted upon by heat or when irradiated.

3. The lithographic printing plate precursor as claimed in claim 1, wherein said crosslinked hydrophilic layer is the crosslinked graft copolymerized polymer of the hydrophilic macromer.

4. The lithographic printing plate precursor as claimed in claim 1, wherein said crosslinked hydrophilic layer has a thickness of 0.01 to 50 $g/m^2$.

5. A lithographic printing plate precursor comprising a crosslinked hydrophilic layer comprised of a crosslinked graft-copolymerized polymer of a hydrophilic macromer, and an image-forming layer, provided on a support in this order.

6. The lithographic printing plate precursor as claimed in claim 5, wherein said image-forming layer contains a polymer compound having a functional group which changes in its hydrophilicity or hydrophobicity when acted upon by heat or acid, or when irradiated.

7. The lithographic printing plate precursor as claimed in claim 5, wherein said crosslinked hydrophilic layer has a thickness of 0.001 to 50 $g/m^2$.

* * * * *